United States Patent [19]

Starkweather

[11] Patent Number: 5,298,803
[45] Date of Patent: Mar. 29, 1994

[54] PROGRAMMABLE LOGIC DEVICE HAVING LOW POWER MICROCELLS WITH SELECTABLE REGISTERED AND COMBINATORIAL OUTPUT SIGNALS

[75] Inventor: Michael W. Starkweather, Boise, Id.

[73] Assignee: Micron Semiconductor, Inc., Boise, Id.

[21] Appl. No.: 914,361

[22] Filed: Jul. 15, 1992

[51] Int. Cl.⁵ .............................. H03K 19/173
[52] U.S. Cl. ................... 307/465; 307/465.1
[58] Field of Search .............. 307/465, 465.1, 468

[56] References Cited

U.S. PATENT DOCUMENTS

| | | | |
|---|---|---|---|
| 3,287,702 | 11/1966 | Borck, Jr. et al. | |
| 3,287,703 | 11/1966 | Slotnick | |
| 3,296,426 | 1/1967 | Ball | |
| 3,313,926 | 4/1967 | Minnick | |
| 3,423,646 | 1/1969 | Cubert et al. | |
| 3,462,742 | 8/1969 | Miller et al. | |
| 3,473,160 | 10/1969 | Wahestrom | |
| 3,514,543 | 11/1970 | Crawford et al. | 340/324 |
| 3,535,498 | 10/1970 | Smith, Jr. | |
| 3,566,153 | 2/1971 | Spencer, Jr. | 307/468 |
| 3,602,733 | 8/1971 | Aoki | 307/209 |
| 3,702,985 | 11/1972 | Probsting | 340/166 R |
| 3,737,866 | 6/1973 | Gruner | 340/172.5 |
| 3,757,306 | 9/1973 | Boone | 340/172.5 |
| 3,769,525 | 10/1973 | Foss et al. | 307/465 |
| 3,774,171 | 11/1973 | Regetz | 365/105 |
| 3,792,242 | 2/1974 | Preel | 307/209 |
| 3,795,901 | 3/1974 | Boehm et al. | 340/172.5 |
| 3,798,606 | 3/1974 | Henle et al. | 340/172.5 |
| 3,803,587 | 4/1974 | Mead | 340/336 |
| 3,816,725 | 6/1974 | Greer | 364/716 |
| 3,818,252 | 6/1974 | Chiba et al. | 307/303 |
| 3,818,452 | 6/1974 | Greer | 340/825.83 |
| 3,832,489 | 8/1974 | Kreshna | 178/71 |
| 3,849,638 | 11/1974 | Greer | 364/716 |
| 3,906,255 | 9/1975 | Mensch, Jr. | 307/448 |
| 3,912,947 | 10/1975 | Buchanan | 307/269 |
| 3,924,243 | 12/1975 | Vermeulen | 364/900 |
| 3,967,059 | 6/1976 | Moore, III et al. | 178/58 |
| 3,974,366 | 8/1976 | Hebenstreit | 364/716 |
| 3,979,730 | 9/1976 | Bennett et al. | 364/200 |
| 3,983,538 | 9/1976 | Jones | 364/716 |
| 3,987,410 | 10/1976 | Beausoleil et al. | 340/146.3 |
| 3,990,045 | 11/1976 | Beausoliel et al. | 340/146.3 |
| 4,034,349 | 7/1977 | Monaco et al. | 364/200 |
| 4,034,356 | 7/1977 | Howley et al. | 340/173 |
| 4,037,089 | 7/1977 | Horninger | 235/152 |
| 4,044,312 | 8/1977 | D'Ortenjio | 328/165 |
| 4,078,259 | 3/1978 | Soulsby et al. | 364/900 |
| 4,091,359 | 5/1978 | Rossier | 340/166 R |
| 4,093,998 | 6/1978 | Miller | 364/900 |
| 4,107,785 | 8/1978 | Seipp | 364/900 |
| 4,124,899 | 11/1978 | Birkner et al. | |
| 4,128,873 | 12/1978 | Lamlaux | 364/200 |
| 4,218,740 | 8/1980 | Bennett et al. | 364/200 |
| 4,422,072 | 12/1983 | Cavlan | 340/825.87 |
| 4,554,640 | 11/1985 | Wong et al. | 364/716 |
| 4,717,912 | 1/1988 | Harvey et al. | 340/825.87 |
| 4,742,252 | 5/1988 | Agrawal | 307/465 |
| 4,758,746 | 7/1988 | Birkner | 307/468 |
| 4,763,020 | 8/1988 | Takata et al. | 307/465 |
| 4,771,285 | 9/1988 | Agrawal et al. | 340/825.83 |
| 4,789,951 | 12/1988 | Birkner | 307/465 |
| 4,847,612 | 7/1988 | Kaplinsky | 340/825.8 |
| 4,879,481 | 11/1989 | Pathak | 307/465 |

(List continued on next page.)

FOREIGN PATENT DOCUMENTS 1444084 7/1976 United Kingdom.

OTHER PUBLICATIONS

H. Fleisher et al "An Introduction To Array Logic" IBM J. Res. Development, p. 132.

"User-Programmable Logic Devices Add Erasability and Hit New Density Levels", Electronic Products, p. 276.

*Primary Examiner*—Edward P. Westin
*Assistant Examiner*—Andrew Sanders
*Attorney, Agent, or Firm*—Michael W. Starkweather

[57] ABSTRACT

A programmable logic device (PLD) is disclosed which has an output macrocell. The macrocell selectively produces either a registered and inverted registered set of signals, or a combinatorial or inverted combinatorial set of signals, but not both set of signals.

2 Claims, 2 Drawing Sheets

U.S. PATENT DOCUMENTS

| | | | |
|---|---|---|---|
| 4,918,641 | 4/1990 | Jigour et al. | 364/716 |
| 4,963,768 | 10/1990 | Agrawal et al. | 307/465 |
| 4,967,107 | 10/1990 | Kaplinsky | 307/465 |
| 5,012,135 | 4/1991 | Kaplinsky | 307/465 |
| 5,027,011 | 6/1991 | Steele | 307/465 |
| 5,027,315 | 6/1991 | Agrawal et al. | 364/900 |
| 5,028,821 | 7/1991 | Kaplinsky | 307/465 |
| 5,055,718 | 10/1991 | Galbraith et al. | 307/465 |
| 5,059,828 | 10/1991 | Tanagawa | 307/465 |
| 5,121,006 | 6/1992 | Redusen | 307/465 |
| 5,136,188 | 8/1992 | Ha et al. | 307/465 |
| 5,148,391 | 9/1992 | Zagar | 365/96 |
| 5,166,556 | 11/1992 | Hsu et al. | 307/465 |
| 5,168,177 | 12/1992 | Shankar et al. | 307/465 |

OTHER PUBLICATIONS

Use of Laser Mechanicm in Priorities Breaks Price and Maintenance Barriers, Jan. 15, 1985 p. 277.

J. E. Elliott, et al., "Array Logic Processing", IBM, Tech. Disclosure Bulletin, vol. 18 No. 21, Jul. 1973, pp. 219 & 220.

H. Fleisher, et al., "Reconfigurable Machine", IBM Tech. Disclosure Bulletin, vol. 16 No. 10 Mar. 1974, pp. 221, 222 & 223.

H. Fleisher et al, "An Introduction to Array Logic" IBM J. Research & Development, Mar. 1975 pp. 98–104.

Jones "Array Logic Macros" IBM J. Research and Development Mar. 1975, pp. 120–126.

Andres, "MOS Programmable Logic Arrays" A Texas Instrument Application Report Oct. 1970 pp. 1–13.

Barna et al, Integrated Circuits in Digital Electronics John Wiley & Sons 1973, pp. 412–419 and 84–91 and FIGS. 11–34.

Wood "High-Speed Dynamic, Programmable Logic Array Chip" IBM J. Res. Develop. Jul. 1975, pp. 379–381.

Boysel, "Memory on a Chip: a step toward large-scale integration" Electronics, Feb. 6, 1967 pp. 93–97.

Wilkes et al "The design of the Control Unit of an Electronic Digital Computer" The Institution of Electrical Engineers, Jun. 1957, pp. 121–128.

Mrazek, "PLAS Replace ROMs per Logic Designs" Electronic Design Oct. 25, 1973 pp. 66–70.

Howley et al. "Programmable Logic Array Decoding Technique" IBM Tech. Disclosure Bulletin, vol. 17 No. 10 Mar. 1975–p. 2988.

Henel "The PLA: a different kind of ROM" Electronic Design, Jan. 5, 1976 pp. 78–84.

Kidder, The Soul Of A New Machine, 1982 pp. 118–128 and 268–269.

National Semiconductor Inc. "Data Update MOS." Aug. 1972, pp. 86 and 87.

Blakeslee, Digital Design With Standard MSI and LSI, John Wiley and Sons, 1975, pp. 67–77, 94–99, and 104–105.

PAL Handbook, Monolithic Memories, Inc. 1978 p. N/A.

Hutton et al. "A Simplified Summation Array for Cellular Logic Modules" IEEE Trans. On Computers, Feb. 1974 pp. 203–206.

Programmable Logic-A Basic Guide for the Designer, Data I/O Corp. 1983-pp. 20–25.

The TTL Data Book For Design Engineers, Texas Instruments Inc., 1973 pp. 295, 303, 473, 458 and 480.

Monolithic Memories Inc. Form 10-K, Oct. 3, 1982 Annual Report Pursuant to Section 13 or 15(2) of the Securities Exchange Act of 1934.

"The Role of Software in the Growth of PLDs" The Technology Research Group Letter vol. 1 No. 13, Nov. 1985 p. 3.

Teil et al. "A Logic Minomyer for KLSI PLA Design" ACM IEEE Ninteenth Design Automation Conf. Proceedings Jun. 1982, pp. 156–162.

Harrin "Programmable Logic Devices Gain Software Support" EDN Feb. 9, 1984, pp. 67–74.

Monolithic Memories Annual Report 1981, Letter to Shareholders p. 2.

"Semicustom IC Update, Field Programmable Logic Devices" VISI from the Valley, Hambrecht & Guest Inc. vol. 3 No. 1, Mar. 1986 pp. 4–7.

Phelps, Institutional Research Report on Monolithic Memories, Inc., A publication of Woodman, Kirkpatrick & Gilbrath Aug. 30, 1984.

Wood "High-Speed Dynamic Programmable Logic Array Chip" IBM J. Res. Develop. Jul. 1975, pp. 379–381.

Covlan et al. "Field PLAS Simplify Logic Designs" reprinted from Electronic Design, Sep. 1, 1975.

Signetics BIPOLAR and MOS Memory, Data Manual Signetics Inc, pp. 156–165 Jan. 1979.

Dorman "PLAS on MPs at times they complete at home they cooperate" Electronic Design, 18 Sep. 1, 1976, pp. 24–30.

Elliot et al "Array Logic Processing" IBM Tech. Disclosure Bulletin, vol. 16, No. 2 Jul. 1973 pp. 586–587.

MacWorld, The Macintosh Magazine, May–Jun. 1984.

PROGRAMMABLE LOGIC DEVICE HAVING LOW POWER MICROCELLS WITH SELECTABLE REGISTERED AND COMBINATORIAL OUTPUT SIGNALS

CROSS-REFERENCES TO RELATED AND COPENDING APPLICATIONS

U.S. patent application Ser. No. 817,167, filed Jan. 6, 1992, is a CMOS logic cell for high-speed, zero-power programmable array logic devices, having common assignee with the present invention.

U.S patent application Ser. No. 865,007, filed Apr. 8, 1992, is a field programmable logic array with speed optimized architecture, having common assignee with the present invention.

U.S. patent application Ser. No. 884,104, filed May 15, 1992, is a field programmable logic array with two OR arrays, having common assignee with the present invention.

U.S. patent application Ser. No. 883,076, filed May 15, 1992, is a programmable logic device macrocell with an exclusive feedback line and an exclusive external input line, having common assignee with the present invention.

U.S. patent application Ser. No. 883,759, filed May 15, 1992, is a field programmable logic device macrocell with an exclusive feedback line and an exclusive external input line, having common assignee with the present invention.

U.S. patent application Ser. No. 884,505, filed May 15, 1992, is a field programmable logic device macrocell with an exclusive feedback line and an exclusive external input line for a combinatorial mode and accommodating two separate programmable or planes, having common assignee with the present invention.

U.S. patent application Ser. No. 883,843, filed May 15, 1992, is a field programmable logic device macrocell with an exclusive feedback line and an exclusive external input line for a state counter or registered sum-of-products, having common assignee with the present invention.

U.S. patent application Ser. No. 883,078, filed May 15, 1992, is a field programmable logic device macrocell with an exclusive feedback line and an exclusive external input line for registered and combinatorial modes using a dedicated product term for control, having common assignee with the present invention.

FIELD OF THE INVENTION

This invention relates to programmable logic arrays (PLA); particularly, a field PLA, known as an FPLA, having macrocells that provides either a set of combinatorial or a set of registered signals which are routed to each output pin.

BACKGROUND OF THE INVENTION

History

The introduction of programmable logic devices (PLD) was a true revolution in the hardware design world. It enabled engineers to shrink circuits requiring several devices onto a single device thus simplifying their designs while saving space and power. Traditionally, PLDs have been used in combinational circuits such as address decoders as well as sequential circuits such as bus arbitration schemes. During the last few years. advances and improvements in PLD architectures enabled the devices to grow more complex while addressing the never-ending quest for higher density and faster speeds.

A certain class of FPLDs has been developed which are known as field programmable logic devices, or FPLDs for short. FPLDs chips that can be programmed or modified by the chip users or purchasers with the aid of readily available programming equipment to change the logic circuitry as desired.

For example, one common usage of PLDs is to provide two types of output signals. A first type of output signal is known as registered or stored signals. This signal is enabled through the use of registers positioned in output structures known as macrocells. A second type of output signal is known as combinatorial or non-registered signals. This second type of signal is accomplished by not sending the logic signals, entering the macrocell, through registers; thus being unstored signals or combinatorial logic signals.

Problem

A problem occurs when the FPLD's output macrocells are required to produce varying numbers of registered and combinatorial output signals. Specifically, there are a limited number of output pins for each chip, and many FPLDs have only a combinatorial output for one set of pins, and registered outputs for a second set of pins. For example, a twelve pin chip may have six pins for each output signal type.

Another problem occurs when certain designs produce all the signal choices and send them to each single output pin even though only one will be used. Specifically, there is a great deal of power required to produce all the needed signals to choose from for outputting over a pin.

SUMMARY OF THE INVENTION

The present invention provides for a PLD architecture involving a macrocell which allows both registered and combinatorial output signals to reach each output pin requiring low power for providing the selected signal choice to the output pin.

Features of the present invention will become clear from the following detailed description of the invention, taken in conjunction with the accompanying drawings.

DETAILED DESCRIPTION OF THE ILLUSTRATED EMBODIMENT

Incorporated Material

For the purpose of providing background material which may in some respects illustrate the state of the art, the following books are herein incorporated by reference: "Programmable Logic Handbook," fourth edition, by Monolithic Memories Inc., 2175 Mission College Blvd., Santa Clara, Calif.; and "Practical Design Using Programmable Logic," by D. Pellerin and M. Holley, Prentice Hall, library of Congress no. TK7872 .L64 P44 1991.

The following U.S. patents are herein incorporated by reference: U.S. Pat. No. 3,423,646, is a computer logic device consisting of an array of tunneling diodes, isolators and short circuits. U.S. Pat. No. 3,566,153, is a programmable sequential logic device. U.S. Pat. No. 4,124,899, is a programmable array logic circuit. U.S. Pat. No. 4,717,912, an apparatus for producing any one of a plurality of signals at a single output. U.S. Pat. No. 4,758,746, is a programmable logic array with added array of gates and added output routing flexibility.

Significant Words and Phrases

It is noted that in the following discussions, the term Tri-state, is another name for a three-state or 3-state device. Additionally, flip-flops are also referred to as registers, latches, storage devices, or memory elements. A macrocell can be defined as an output circuit coupled to the end of the logic circuits and containing multiplexers, buffers, registers, etc., and an output driver. Lastly, when discussing or illustrating output pads, drivers or buffers are not always stated or illustrated, although they are generally needed.

It is noted that this definitions section, in no way is meant to limit the scope of the defined words. The provided definitions are not meant to be exact and complete scientific or linguistic definitions. These definitions or explanations are only meant to be an assistance to the readers in a broad, and at times less than complete, manner.

SPECIFIC EMBODIMENT

Figure 1:
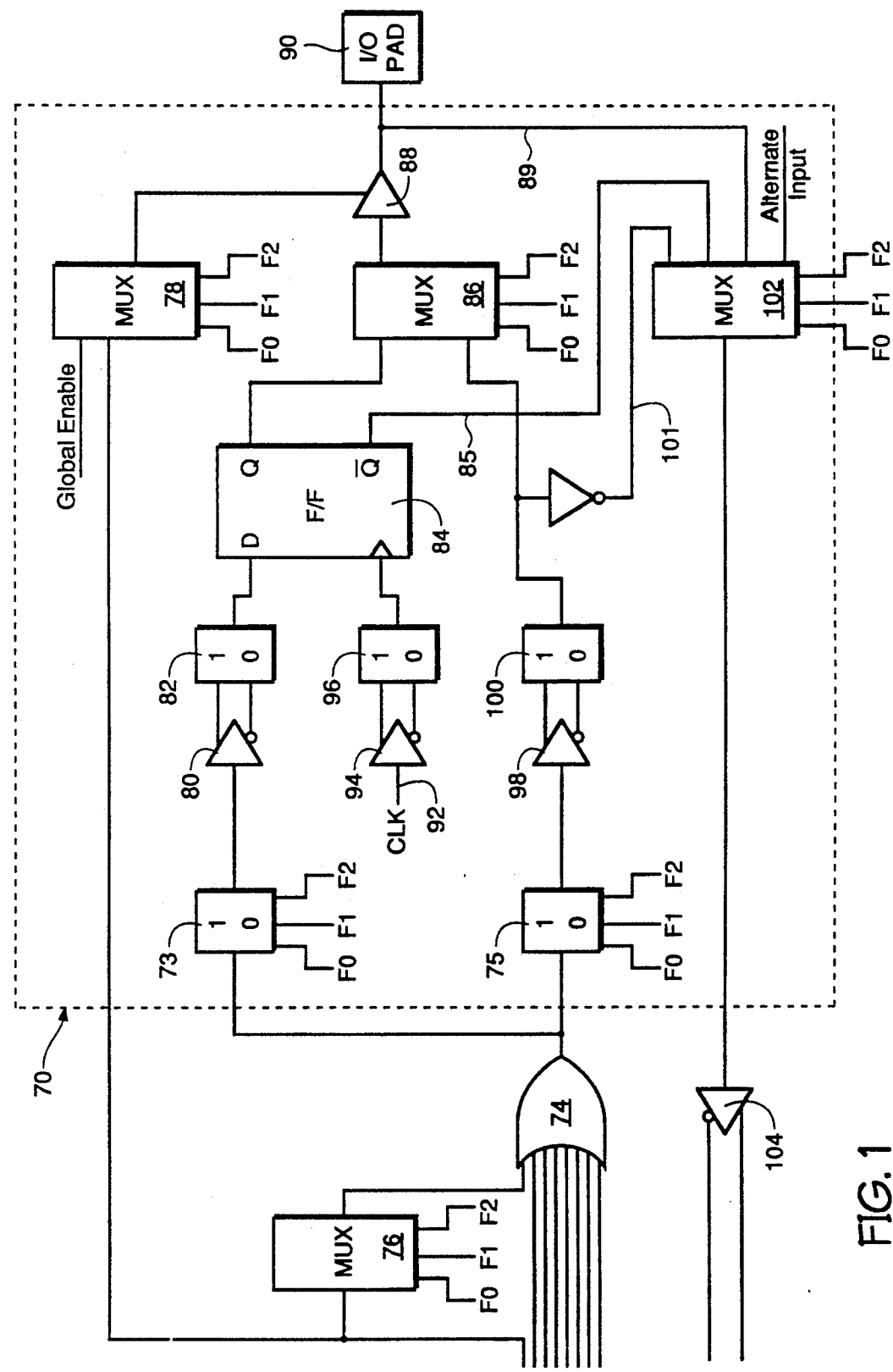
FIG. 1 is an illustration of the PLD macrocell.

FIG. 1 is a detailed illustration of the invention and includes the following elements: An OR array 74 has inputs from a programmable logical AND array (not shown), and an output that lead to macrocell 70. Multiplexer 76 takes a product term from the AND array to an 8×1 multiplexer 78 having a global enable line. Array 74 has its output sent to two three-fuse (F0, F1, and F2) one-zero multiplexers 73 and 75. Mux 73 is electrically coupled to I/O pad 90 via buffer 80, multiplexer 82, a D-type flip-flop 84 (register), an 8×1 multiplexer 86, and a tri-state 88. Clock signal 92 is coupled to register 84 via buffer 94 and multiplexer 96. Mux 75 is electrically connected to I/O pad 90 via buffer 98, mux 100, mux 86, and tri-state 88. An 8×1 multiplexer 102 has inputs from 1) I/O pad 90 via exclusive input line 89, 2) register 84 on Q bar via exclusive registered feedback line 85, 3) combinatorial signal line from mux 100 via exclusive combinatorial feedback line 101, and 4) an alternate input. The lone output of mux 102 is an input line to the programmable AND array via input buffer 104.

Figure 2:
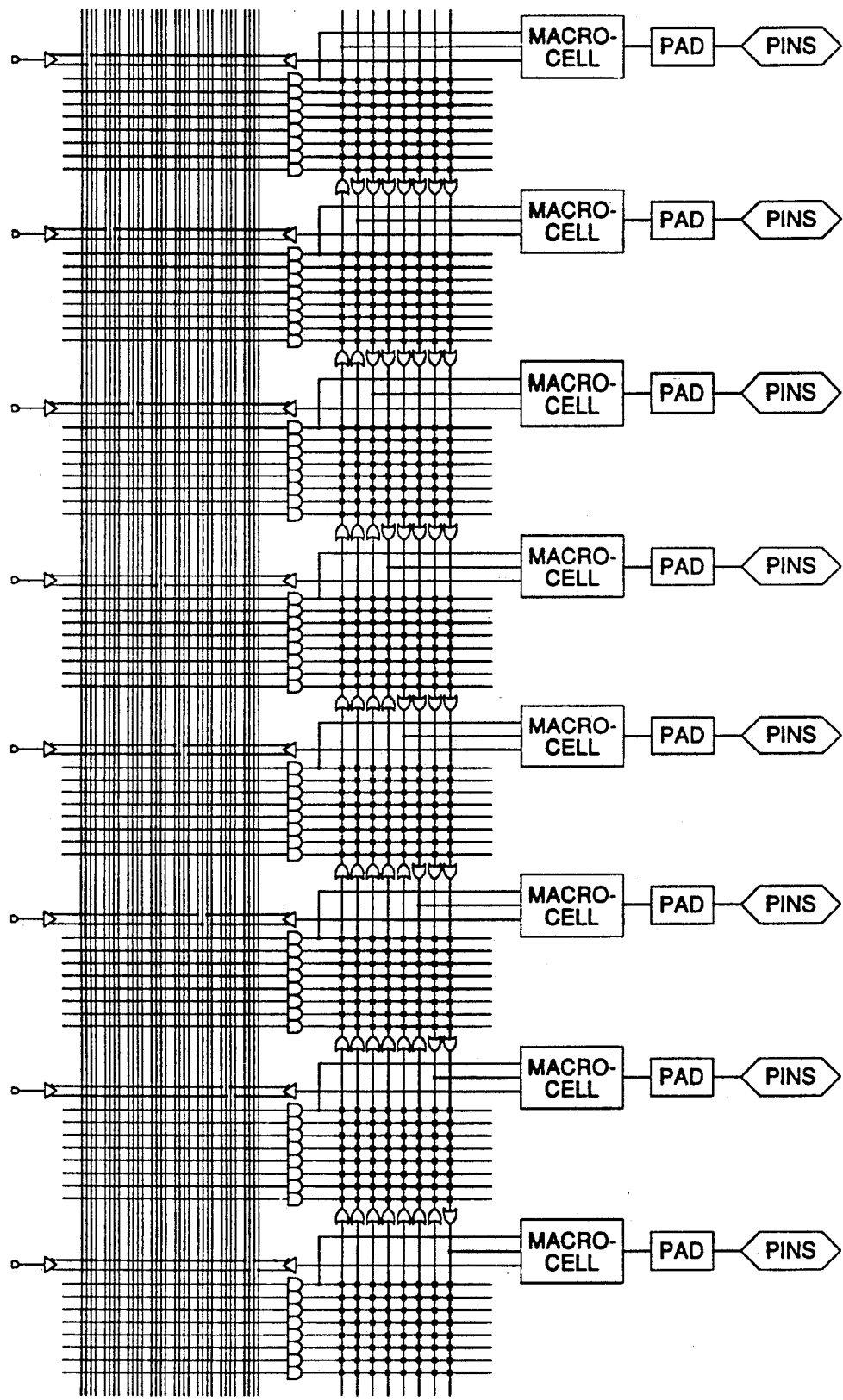
FIG. 2 is a detailed overall illustration of the invention.

FIG. 2 illustrates a full view of a FPLA embodiment. One skilled in the art will recognize the programmable AND array having external IC signal inputs, and outputs that lead to the programmable OR array. Similarly, it is noted that the OR array is designed to rout signals to a selection of output macrocells. The macrocells are coupled to output pads which are coupled to output pins. Finally, it is noted that a fixed OR array would also work with this invention.

OPERATION

One skilled in the art will understand the operation of the invention with reference to the drawings and the following description. Uniquely, one signal enters the macrocell from OR array 74. If a registered signal is needed then mux 73 has fuses to program a 1 (one) and mux 75 is set to a 0 (zero). Thus, the input signal will only be coupled to flip-flop F/F or register 84, creating the registered mode from this first circuit path. Additionally, when the registered signal needs to be inverted, mux 82 will be programmed for a 0 (zero). Thus, a registered inverted signal is generated and sent to the output pin via pad 90.

One skilled in the art will understand from the above description and from the drawings that two other unique signals may be singularly generated in a similar fashion as described above by way of a second circuit path. Mux 73 will be set to a 0 (zero), preventing generation of any registered signals by not allowing logic signals from the OR array to enter this first circuit path. Whereby, mux 75 is set to a 1 (one), allowing generation of the combinatorial logic signals. Namely, the two combinatorial signals would be 1) a non-registered or combinatorial signal, and 2) an inverted combinatorial signal.

For allowing external input signals to enter over pad 90, three-state 88 is disabled via mux 78, and mux 102 selects the exclusive input line 89. This allows the external signal to be routed to the AND array and then to the OR array before entering the macrocell.

There are two ways to feedback array 74 signals to the AND array. Exclusive feedback line 85 is selected by mux 102 for registered signal feedback. Exclusive feedback line 101 is selected by mux 102 for combinatorial signal feedback.

While the invention has been taught with specific reference to one embodiment, someone skilled in the art will recognize that changes can be made in form and detail without departing from the spirit and the scope of the invention.

Although subheadings are used herein, these are merely provided for assisting the reader; wherein, the writer is free to enter any information under any heading/s.

I claim:

1. A field programmable logic device (FPLD), comprising:
   a) a single AND array, receiving external and internal input signals, and outputting product signals in response therefrom;
   b) a single OR array, receiving the product signals and outputting sum-of-products signals in response thereto;
   c) a plurality of macrocells, having logic signal input lines coming directly form the AND and OR array, and not by way of other macrocells, so that each of the logic signal input lines to each macrocell consists essentially of:
      c1) a enabled input line, originating from the OR array, for providing a sum-of-products signal to the macrocell;
      c2) a disabled input line, originating from the first input line, for providing to the macrocell the sum-of-products signal from the first input line, and
      c3) a product input line, originating from the AND array, for providing to the macrocell a product signal from the AND array;
   d) each macrocell further including:
      d1) register means for creating a registered signal from the sum-of-products signal originating from the disabled input line;
      d2) non-register means for creating a non-registered signal from the sum-of-products signal originating from the enabled input line;
      d3) a first multiplexer, receiving the registered and non-registered signal, and outputting a selected signal, where the selected signal is either the registered or non-registered sum-of-product signal;

d4) an input/output (I/O) pad that receives and then outputs the selected signal, the I/O pad receives an other external signal for inputting to the macrocell over a macrocell external-input line;

d5) a tri-state device, directly receiving the selected signal, the tri-state device having:
 a first state that allows outputting of the selected signal, and
 a second state that prevents the outputting of the selected signal and allows the other external signal to be inputted over the I/O pad;

d6) a feedback multiplexer,
 i) directly electrically coupled to the register means, for receiving a complement of the registered signal,
 ii) directly electrically coupled to the non-registered means, for receiving a complement of the non-registered signal
 iii) directly electrically coupled to the macrocell external-input line, for receiving the other external signal from the I/O pad, and
 iv) for outputting one of the three received signals, now identified as a macrocell feedback signal;

d7) a first control multiplexer, receiving the product signal, and outputting a control signal, where the activation of the first and second states of the tri-state device is controlled by the control signal;

d8) a first control device means, coupled to the first input line, for controlling whether the sum-of-products signal will enter or not enter the macrocell; and d9) a second control device means, coupled to the disabled input line, for controlling whether the sum-of-products signal will enter or not enter the macrocell.

2. A macrocell from a PLD device, comprising:

a) the macrocell is designed to receive logic signals, excluding logic signal from other macrocells, directly from the AND array and OR array of the PLD device, consisting essentially of:
 a1) a first input line, for receiving a first input signal being a sum-of-products signal;
 a2) a second input line, for receiving the same first input signal;
 a3) a first product signal originating from the AND array;
 a4) the first input signal on the first input line becoming a registered signal inside the macrocell; and
 a5) the first input signal on the second input line becoming a non-registered signal inside the macrocell;

b) first decision means, electrically receiving the registered signal and non-registered signal, for determining if the registered or non-registered signal will be output from the first decision means;

c) an input/output (I/O) pad;

d) gating means, for receiving the output from the first decision means and, for either enabling or disabling the gating means:
 d1) when the gating means is enabled the selected registered or non-registered signal will be outputted from the PLD over the I/O pad (90); or
 d2) when the gating means is disabled on external signal will be inputted into the macrocell over the I/O pad (90);

e) second decision means for determining whether the registered, non-registered, or external signal will be routed into the AND array; and f) determining means, having an input from the first product signal, for either enabling or disabling the gating means;

g) second decision means, coupled to receive a complement of the registered signal, a complement of the non-registered signal, and the other external input signal, for deciding whether 1) the registered signal, 2) the non-registered signal, or 3) the other external signal will be fed back to the AND array.

* * * * *